United States Patent
Onda

(10) Patent No.: US 8,552,510 B2
(45) Date of Patent: Oct. 8, 2013

(54) SEMICONDUCTOR DEVICE HAVING RING-SHAPED GATE ELECTRODE, DESIGN APPARATUS, AND PROGRAM

(75) Inventor: Takamitsu Onda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 415 days.

(21) Appl. No.: 13/026,635

(22) Filed: Feb. 14, 2011

(65) Prior Publication Data
US 2011/0199126 A1 Aug. 18, 2011

(30) Foreign Application Priority Data
Feb. 18, 2010 (JP) .................................. 2010-033740

(51) Int. Cl.
*H01L 27/088* (2006.01)

(52) U.S. Cl.
USPC .... 257/401; 257/240; 257/249; 257/E21.237; 257/E21.303; 257/E21.304; 438/690; 438/691; 438/692; 438/926; 438/959

(58) Field of Classification Search
USPC ................. 257/213, 240, 249, 262, 263, 267, 257/287, 288, 401, E29.12, E29.122, E21.215, 257/E21.237, E21.303, E21.304; 438/690, 438/691, 692, 926, 959
See application file for complete search history.

(56) References Cited

U.S. PATENT DOCUMENTS 6,020,616 A * 2/2000 Bothra et al. ................. 257/381
2006/0038233 A1 * 2/2006 Otsuki .......................... 257/365

FOREIGN PATENT DOCUMENTS
JP 09-107028 4/1997

* cited by examiner

*Primary Examiner* — Eduardo A Rodela
(74) *Attorney, Agent, or Firm* — McDermott Will & Emery LLP

(57) ABSTRACT

A semiconductor device includes: a substrate; a transistor that has a ring-shaped gate electrode formed on the substrate; a plurality of external dummy electrodes that are arranged outside the gate electrode and are formed in the same layer as the gate electrode; and at least one internal dummy electrode that is arranged inside the gate electrode and is formed in the same layer as the gate electrode.

17 Claims, 13 Drawing Sheets

SEMICONDUCTOR DEVICE HAVING RING-SHAPED GATE ELECTRODE, DESIGN APPARATUS, AND PROGRAM

BACKGROUND OF THE INVENTION

1. Field of the Invention

The present invention relates to a semiconductor device, a design apparatus, and a program, and more particularly to a semiconductor device which includes ring-gate MOS transistors, and a design apparatus and a program for designing the semiconductor device.

2. Description of Related Art

When manufacturing semiconductor devices such as a dynamic random access memory (DRAM), chemical mechanical polishing (CMP) process is used for planarization processing. The CMP process is characterized by feeding of slurry that contains various chemical components while mechanically polishing the object to be polished. The chemical components modify the surface for effects such as improved processing rate and a reduction of fine scratches on the surface.

CMP process is also used for planarizing the surface of an insulating film deposited on a wiring pattern. When using the CMP process for such applications, so-called dishing phenomenon can occur if the wiring pattern under the insulating film has a wide open area. The dishing phenomenon refers to the formation of a dish-like recess in that part of the insulating film. To avoid occurring of the dishing phenomenon, it is effective to form a dummy pattern around the wiring pattern so as to reduce the open area. Japanese Patent Application Laid-Open Publication No. H09-107028 discloses an example of the dummy pattern.

The inventor of the present invention has studied the use of metal oxide semiconductor (MOS) transistors having a ring-shaped gate electrode (ring-gate MOS transistors) for a semiconductor device with the purpose of obtaining large gate widths.

A ring-gate MOS transistor can be fabricated generally by the following manufacturing steps. Initially, a gate insulating film and a gate electrode are formed on a semiconductor substrate, followed by patterning into a ring shape. Next, an insulating film (sidewalls and a gate cap) is formed on the sides and top of the gate electrode. Impurities for forming impurity diffusion regions are implanted into the semiconductor substrate inside and outside the ring. Typically, the inside of the ring is a drain region, and the outside a source region. The resultant is covered all over with an interlayer insulating film, and polished by the CMP process until the gate cap is exposed. Subsequently, necessary contact holes are formed in the interlayer insulating film and the gate cap, and contact conductors for connecting the gate electrode, drain, and source to upper wiring are formed therein.

When used for a semiconductor device, a large number of ring-gate MOS transistors are arranged on a single semiconductor substrate. Inevitably, a number of ring-gate MOS transistors are simultaneously formed in a single step. The ring-gate MOS transistors are not always arranged in a closely packed configuration, and the foregoing open area can thus occur between the ring-gate MOS transistors. Since such open areas may cause the foregoing dishing in the CMP step, a dummy pattern is formed in the areas between the ring-gate MOS transistors, if needed, when patterning the gate electrodes.

Some circuits need ring-gate MOS transistors that have an extremely large ring diameter. Having a large area inside the ring, such ring-gate MOS transistors can sometimes cause dishing inside their ring in the CMP step during manufacturing.

As a concrete example, the first input stage circuits and temperature sensing circuit of a DRAM need to use ring-gate MOS transistors of large gate lengths in order to reduce PVT (Process, Voltage, and Temperature) effects. The larger the gate length, the lower the current supply capability becomes accordingly. To compensate the drop, the gate width needs to be made even greater. That is, the ring diameter becomes extremely large.

As described above, dishing phenomenon can occur not only in the areas between ring-gate MOS transistors but also in the areas inside the rings. Developing a technology for suppressing the occurrence of dishing phenomenon has thus been needed.

SUMMARY

In one embodiment, there is provided a semiconductor device comprising: a substrate; a transistor that has a ring-shaped gate electrode formed on the substrate; a plurality of external dummy electrodes that are arranged outside the gate electrode and are formed in the same layer as the gate electrode; and at least one internal dummy electrode that is arranged inside the gate electrode and is formed in the same layer as the gate electrode.

In another embodiment, there is provided a semiconductor device comprising a comparison circuit that compares a voltage to be compared and a reference voltage, and outputs a comparison result signal having a voltage corresponding to the result of comparison, the comparison circuit including first and second transistors that are connected in parallel between power supply wiring and ground wiring, a third transistor that is connected between the first transistor and the power supply wiring, and a fourth transistor that is connected between the second transistor and the power supply wiring, a gate of the third transistor, a gate of the fourth transistor, and a junction between the first transistor and the third transistor being connected to each other, the reference voltage being input to either one of gates of the first and second transistors, the voltage to be compared being input to the other of the gates of the first and second transistors, the comparison result signal being taken out from a junction between the second transistor and the fourth transistor, the first to fourth transistors having respective ring-shaped first to fourth gate electrodes, the semiconductor device further comprising a plurality of external dummy electrodes that are arranged outside the first to fourth gate electrodes, and first to fourth internal dummy electrodes that are arranged inside the first to fourth gate electrodes, respectively, the first to fourth gate electrodes, the plurality of external dummy electrodes, and the first to fourth internal dummy electrodes being formed in the same layer.

In still another embodiment, there is provided a semiconductor device comprising: a substrate; first to fifth transistors that each include a ring-shaped gate electrode formed on the substrate, a gate insulating film formed between the gate electrode and the substrate, a first diffusion region formed in a region of a surface of the substrate corresponding to outside the gate electrode, and a second diffusion region formed in a region of the surface of the substrate corresponding to inside the gate electrode; first to fifth internal dummy electrodes that are arranged inside the gate electrodes of the respective first to fifth transistors and are formed in the same layer as the corresponding gate electrodes; first and second element isolation regions that are embedded in regions of the surface of the substrate corresponding to inside the gate electrodes of the first and second transistors, respectively; substrate potential wiring that supplies a substrate potential; and a contact conductor that connects the substrate potential wiring and the substrate, the first internal dummy electrode being formed on the first element isolation region, the second element isolation region having an opening, the contact conductor connecting the substrate potential wiring and the substrate through the opening, no element isolation region being formed in a region corresponding to inside the gate electrode of the third transistor, a plurality of the fourth internal dummy electrodes being provided, the fifth internal dummy electrode having a ring shape.

In still another embodiment, there is provided a design apparatus comprising: storing unit storing a plurality of configuration patterns of internal dummy electrodes to be arranged inside a gate electrode of a ring-gate transistor; area information acquiring unit acquiring area information that shows an inner ring area of the ring-gate transistor; and selecting unit selecting and outputting one of the plurality of configuration patterns stored in the storing unit depending on the area information acquired by the area information acquiring unit.

In still another embodiment, there is provided a computer-readable medium including a computer program making a computer that includes storing unit storing a plurality of configuration patterns of internal dummy electrodes to be arranged inside a gate electrode of a ring-gate transistor function as: area information acquiring unit acquiring area information that shows an inner ring area of the ring-gate transistor; and selecting unit selecting and outputting one of the plurality of configuration patterns stored in the storing unit depending on the area information acquired by the area information acquiring unit.

According to the present invention, internal dummy electrodes are arranged inside the gate electrodes. Such arrangement makes it possible to suppress occurring of the dishing phenomenon not only in the areas between the ring-gate MOS transistors but in the areas inside the rings as well. This consequently suppresses variations of the depth of focus when using lithographic techniques in particular, thereby facilitating manufacturing of semiconductor devices capable of finer processes.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENT

Preferred embodiments of the present invention will be explained below in detail with reference to the accompanying drawings.

Figure 1:
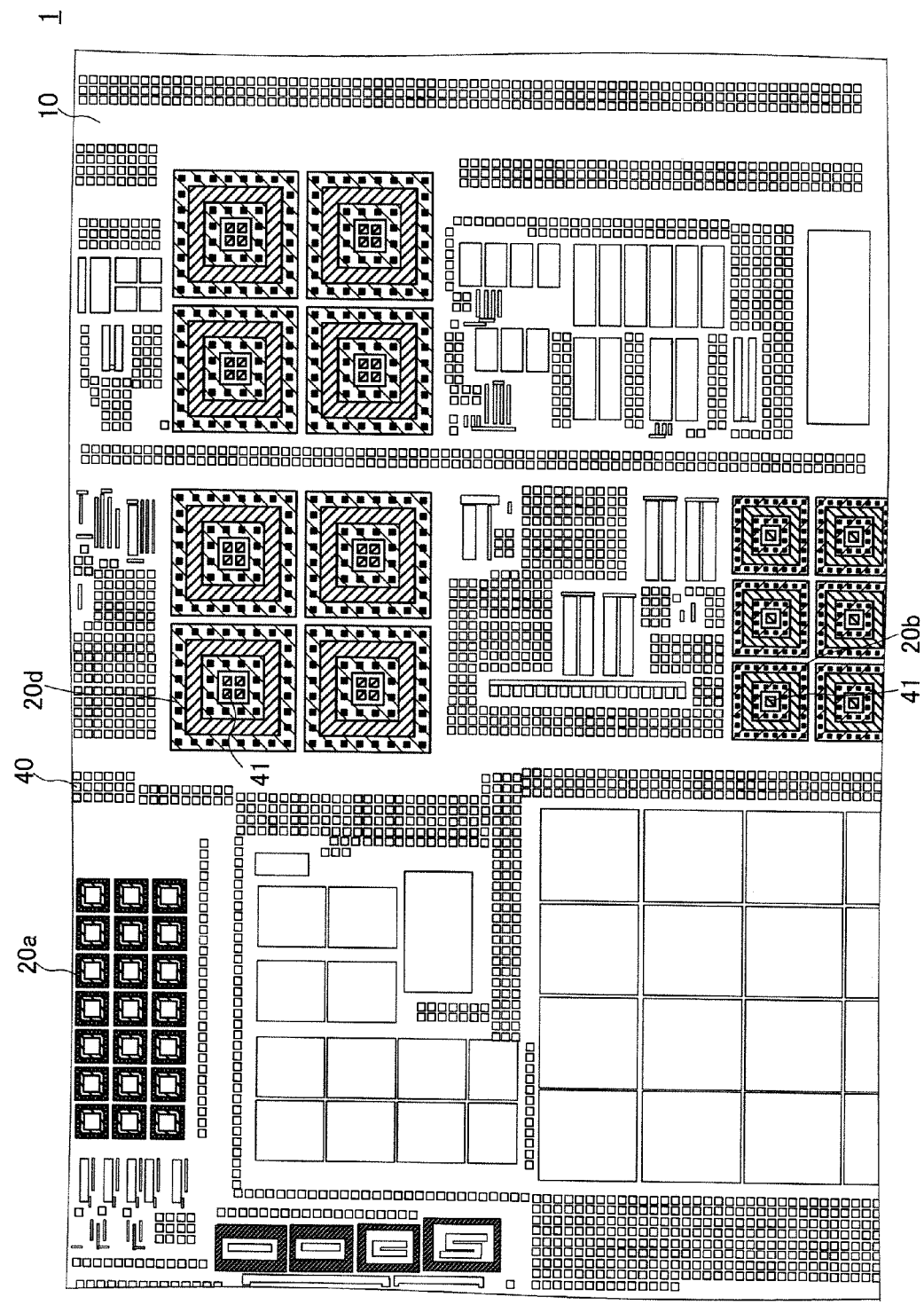
FIG. 1 is a diagram showing part of the planar layout of a semiconductor device according to an embodiment of the present invention.

FIG. 1 is a diagram showing part of the planar layout of a semiconductor device 1 according to an embodiment of the present invention. Examples of the semiconductor device 1 include semiconductor memory devices such as a DRAM, a static random access memory (SRAM), a FLASH memory, and a phase change random access memory (PCRAM). It will be understood that the present invention is not limited to semiconductor memory devices and may be applied to a CPU and other semiconductor devices. As shown in FIG. 1, the semiconductor device 1 has a semiconductor substrate 10 on which various types of circuit elements are formed depending on the intended use. Among such circuit elements are ring-gate MOS transistors mentioned above.

As examples of the ring-gate MOS transistors, FIG. 1 shows three types of transistors 20a, 20b, and 20d which have respective different sizes. In fact, the semiconductor device 1 also includes various other types of ring-gate MOS transistors, which are not shown in FIG. 1 since it is difficult to provide a full representation of the planar layout due to limitations of space.

Specifically, the ring-gate MOS transistors included in the semiconductor device 1 are broadly classified into six types depending on the configuration pattern of internal dummy electrodes formed inside the gate electrode (first to sixth configuration patterns). A first configuration pattern corresponds to an ordinary ring-gate MOS transistor having no internal dummy electrode. An example is the transistors 20a shown in FIG. 1. The reason for not providing an internal dummy electrode is that the internal area of the ring gate is too small to satisfy L/S (line and space) for forming an internal dummy electrode. Second to sixth configuration patterns correspond to ring-gate MOS transistors having an internal dummy electrode or traces each. The transistors 20*b* and 20*d* shown in FIG. 1 correspond to the second and fourth configuration patterns, respectively.

Hereinafter, the structure and applications of a ring-gate MOS transistor that employs the second configuration pattern among the second to sixth configuration patterns will initially be described in detail. Ring-gate MOS transistors employing the other configuration patterns will be described later, mostly dealing with differences from the second configuration pattern.

Figure 2:
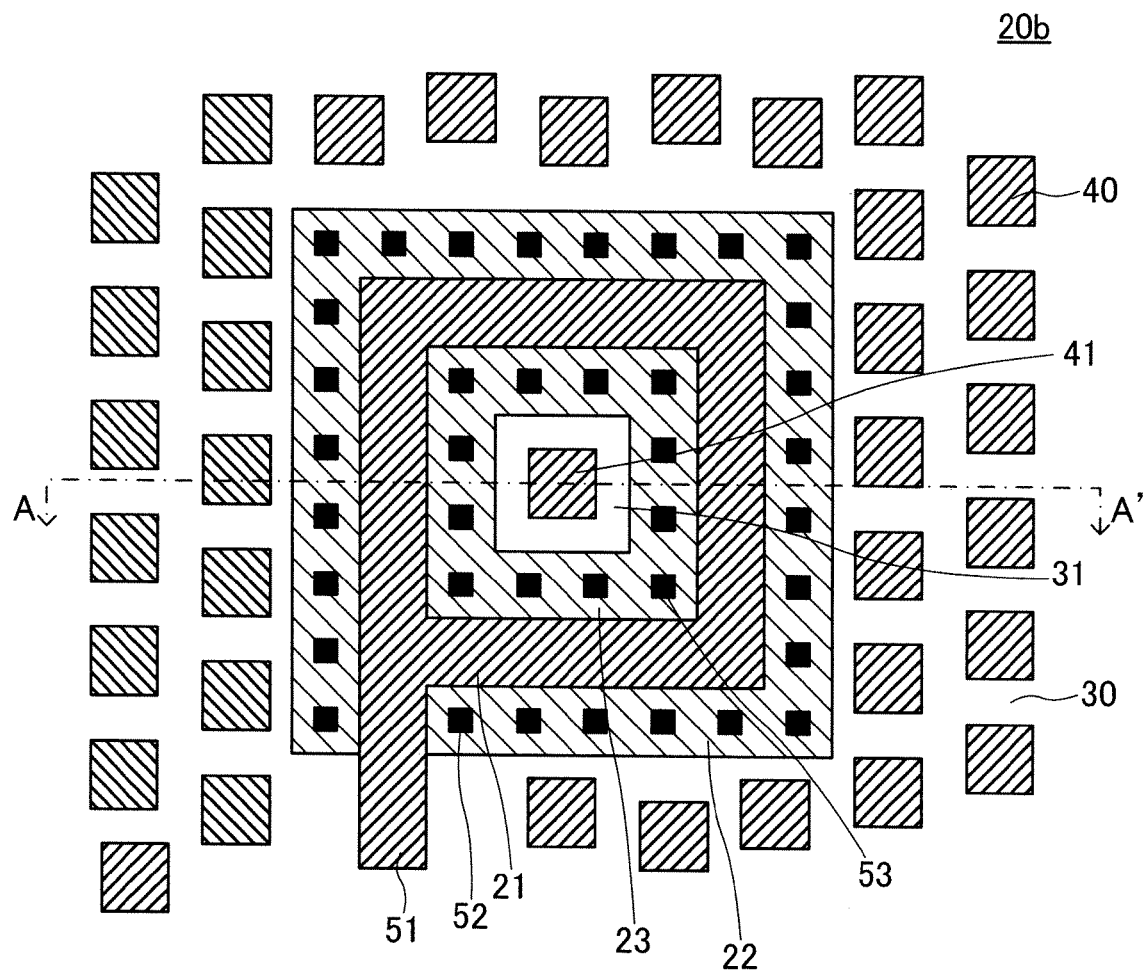
FIG. 2 is a diagram showing the planar structure of the MOS transistor which employs the second configuration pattern according to an embodiment of the present invention.
Figure 3:
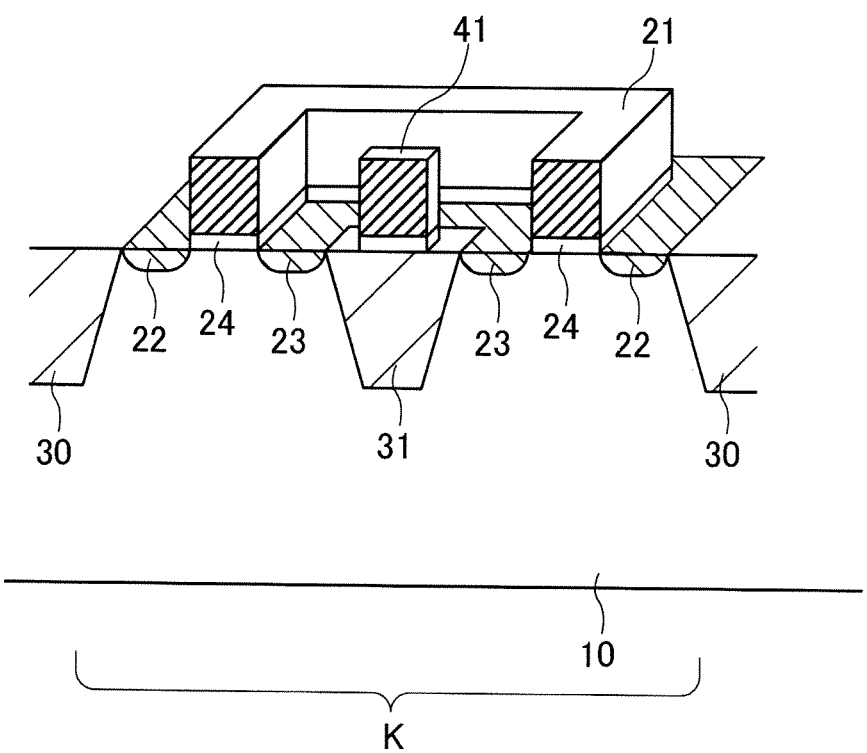
FIG. 3 is a perspective half sectional view showing a cross section of the semiconductor device corresponding to the section that is taken along the line A-A' of FIG. 2.

FIG. 2 is a diagram showing the planar structure of the MOS transistor 20*b* which employs the second configuration pattern. FIG. 3 is a perspective half sectional view showing a cross section of the semiconductor device 1 corresponding to the section that is taken along the line A-A' of FIG. 2. Contact conductors 52 and 53 and external dummy electrodes 40 to be described later are omitted in FIG. 3. An interlayer insulating film that covers the entire MOS transistor 20*b* is omitted both in FIGS. 2 and 3.

The semiconductor device 1 includes first input stage circuits and a temperature sensing circuit. The first input stage circuits compare the voltages of signals received from outside with a reference voltage, and generate internal signals based on the results of comparison. The temperature sensing circuit is intended to sense the temperature of the semiconductor device 1 for output. The MOS transistor 20*b* is suitably used as one of a plurality of ring-gate MOS transistors that constitute such circuits. The first input stage circuits and the temperature sensing circuit will be described in detail later.

As shown in FIG. 3, the MOS transistor 20*b* is formed on the surface of the semiconductor substrate 10. The semiconductor substrate 10 is a P-type silicon substrate which is made of silicon containing P-type impurities. As employed herein, the term "P-type silicon substrate" will also cover P-type diffusion regions (P-wells) formed in the surface of the silicon substrate.

As shown in FIGS. 2 and 3, the MOS transistor 20*b* has a ring-shaped gate electrode 21, a first diffusion region 22, a second diffusion region 23*d*, and a gate insulating film 24. The first diffusion region 22 is formed in a region of the surface of the substrate 10 corresponding to the outside of the gate electrode 21 (hereinafter, referred to as "outer ring region"). The second diffusion region 23 is formed in a region of the surface of the substrate 10 corresponding to the inside of the gate electrode (hereinafter, referred to as "inner ring region"). The gate insulating film 24 is formed between the gate electrode 21 and the substrate 10.

The MOS transistor 20*b* is arranged inside an active area K that is defined by an element isolation region 30 embedded in the surface of the substrate 10 (FIG. 3). The element isolation region 30 is formed by forming a trench in the surface of the substrate 10 and filling the trench with an insulating film.

The MOS transistor 20*b* also has an element isolation region in the inner ring region (element isolation region 31). The element isolation region 31 is formed at a distance from the gate electrode 21 as much as needed to form the second diffusion region 23. Specifically, as shown in FIG. 2, it is preferred that an element isolation region 31 having an area a fraction of that of the inner ring region be formed right in the center of the inner ring region. The element isolation region 31 is preferably formed at the same time with the element isolation region 30.

The gate electrode 21 is a conductive film made of polysilicon, metal, silicide, or a laminate thereof. The gate electrode 21 is erected on the substrate 10 via the gate insulating film 24. The gate electrode 21 may have a planar configuration of rectangular shape with corners such as shown in FIG. 2, or other shapes such as a rectangle with rounded corners and a circle. Although not shown in the diagrams, a cap insulating film is formed on the top of the gate electrode 21, and sidewall insulating films on the sides. The gate electrode 21 is partly connected to a wiring pattern 51 (FIG. 2) which is formed on the surface of the substrate 10, and is connected to other circuit elements by the wiring pattern 51.

To form the gate electrode 21, silicon oxide for making the gate insulating film 24, the material(s) of the gate electrode 21 (mentioned above), and silicon nitride for making the cap insulating film are deposited on the surface of the substrate 10 in succession. The deposition is patterned into the gate electrode 21 of predetermined planar configuration. Subsequently, a thin layer of silicon nitride is further deposited, followed by etch back, whereby the sidewall insulating films are formed on the sides of the gate electrode 21.

The first and second diffusion regions 22 and 23 are N-type impurity diffusion regions which are formed by implanting N-type impurities into the surface of the substrate 10. That is, the MOS transistor 20*b* is an N-channel MOS transistor. The first and second diffusion regions 22 and 23 have contact conductors 52 and 53 (FIG. 2) on their respective top surfaces, and are thereby connected to a not-shown wiring pattern on an upper layer.

The first and second diffusion regions 22 and 23 are formed by implanting N-type impurities into the areas corresponding to the outside and inside of the gate electrode 21 after the formation of the sidewall insulating films on the side surfaces of the gate electrode 21. The contact conductors 52 and 53 are formed after the formation of the interlayer insulating film to be described next, by making contact holes in the interlayer insulating film and filling the contact holes with a conductive material.

The MOS transistor 20*b* is covered all over with the not-shown interlayer insulating film which covers the entire surface of the substrate 10. The interlayer insulating film is formed after the formation of the first and second diffusion regions 22 and 23, by depositing an insulating film of silicon oxide or the like on the surface of the substrate 10 and planarizing the surface by the CMP process. The semiconductor device 1 has dummy electrodes for suppressing a dishing phenomenon which can occur in that CMP process. Hereinafter, the dummy electrodes will be described in detail.

As shown in FIG. 1, the semiconductor device 1 includes a plurality of external dummy electrodes 40 which are arranged in outer ring regions, and a plurality of internal dummy electrodes 41 which are arranged in inner ring regions. In view of each individual MOS transistor 20*b*, the number of internal dummy electrodes 41 is one.

The external dummy electrodes 40 are provided for the purpose of suppressing the occurrence of dishing phenomenon in the outer ring region. The internal dummy electrode 41 is provided for the purpose of suppressing the occurrence of dishing phenomenon in the inner ring region. Both the dummy electrodes 40 and 41 are formed simultaneously with the gate electrode 21. More specifically, at the time of formation of the gate electrode 21, the same gate electrode 21 is formed on the areas corresponding to the dummy electrodes 40 and 41 so as to make the dummy electrodes 40 and 41. As shown in FIG. 3, the dummy electrodes 40 and 41 therefore have the same structure and are formed in the same layer as the gate electrode 21 does/is.

The dummy electrodes 40 and 41 are formed on the top surfaces of the element isolation regions 30 and 31, respectively. In the MOS transistor 20b, only one internal dummy electrode 41 is formed at the center of the element isolation region 30 as shown in FIGS. 1 and 2. Meanwhile, the external dummy electrodes 40 are arranged in numbers around the MOS transistor 20b as shown in FIG. 2. In fact, the external dummy electrodes 40 are arranged not around a certain transistor but so as to fill open areas across the surface of the substrate 10 as shown in FIG. 1.

With the provision of such dummy electrodes 40 and 41, the semiconductor device 1 suppresses the occurrence of dishing phenomenon not only in the outer ring regions of the MOS transistors 20b (areas between circuit elements) but also in the inner ring regions of the MOS transistors 20b.

Figure 4A:
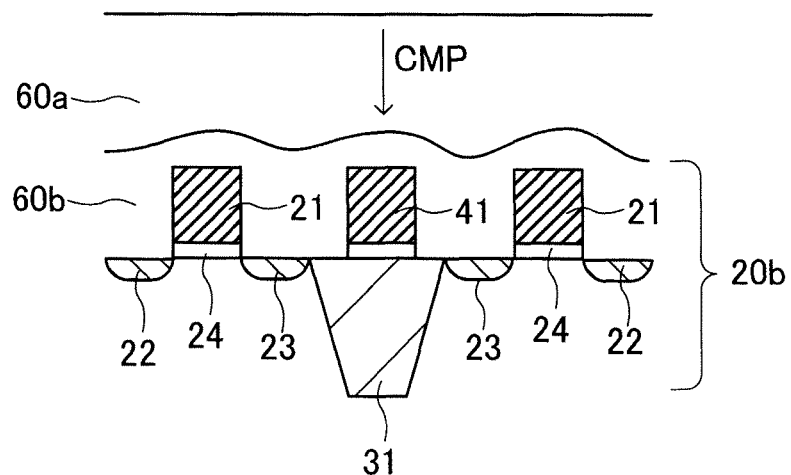
FIG. 4A is a sectional view of the semiconductor device corresponding to the section taken along the line A-A' of FIG. 2.
Figure 4B:
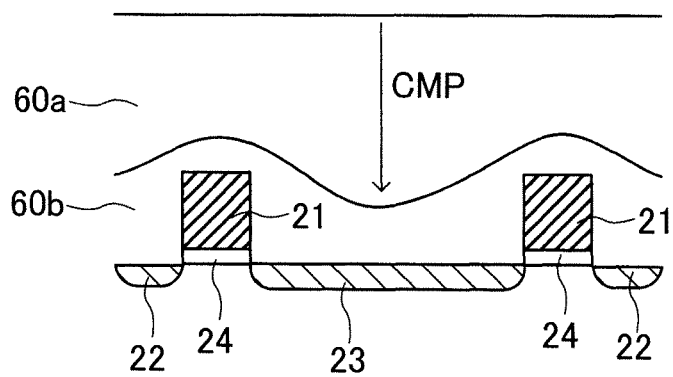
FIG. 4B is a sectional view similar to FIG. 4A, showing a comparative example where the internal dummy electrode is not formed.

FIGS. 4A and 4B are explanatory diagrams for explaining the effect of suppressing the occurrence of dishing phenomenon in the inner ring region. FIG. 4A is a sectional view of the semiconductor device 1 corresponding to the section taken along the line A-A' of FIG. 2. FIG. 4B is a sectional view similar to FIG. 4A, showing a comparative example where the internal dummy electrode 41 is not formed. In either of the diagrams, the element isolation region 30 and the external dummy electrodes 40 are omitted. The interlayer insulating film is shown both before the CMP planarization (interlayer insulating film 60a) and after the CMP planarization (interlayer insulating film 60b).

As shown in FIG. 4B, when there is no internal dummy electrode 41, the top surface of the interlayer insulating film 60b is lower in the inner ring region than in the other areas. This is due to the dishing phenomenon. More specifically, in the comparative example, the presence of the wide open area in the inner ring region causes a high dishing phenomenon.

In the case of the MOS transistor 20b, as shown in FIG. 4A, the provision of the internal dummy electrode 41 reduces the open area in the inner ring region. This suppress the lowering of the top surface of the interlayer insulating film 60b. That is, the occurrence of dishing phenomenon is suppressed in the inner ring region.

It should be appreciated that the MOS transistor 20b also provides the effect of suppressing a parasitic capacitance occurring in the inner ring region in addition to the effect of suppressing the occurrence of dishing phenomenon in the inner ring region. The additional effect results from the formation of the element isolation region 31 which suppresses the area of the second diffusion region 23 smaller.

Next, a specific circuit that includes the MOS transistor 20b will be described in detail in conjunction with the example of the first input stage circuits and temperature sensing circuit mentioned above.

Figure 5:
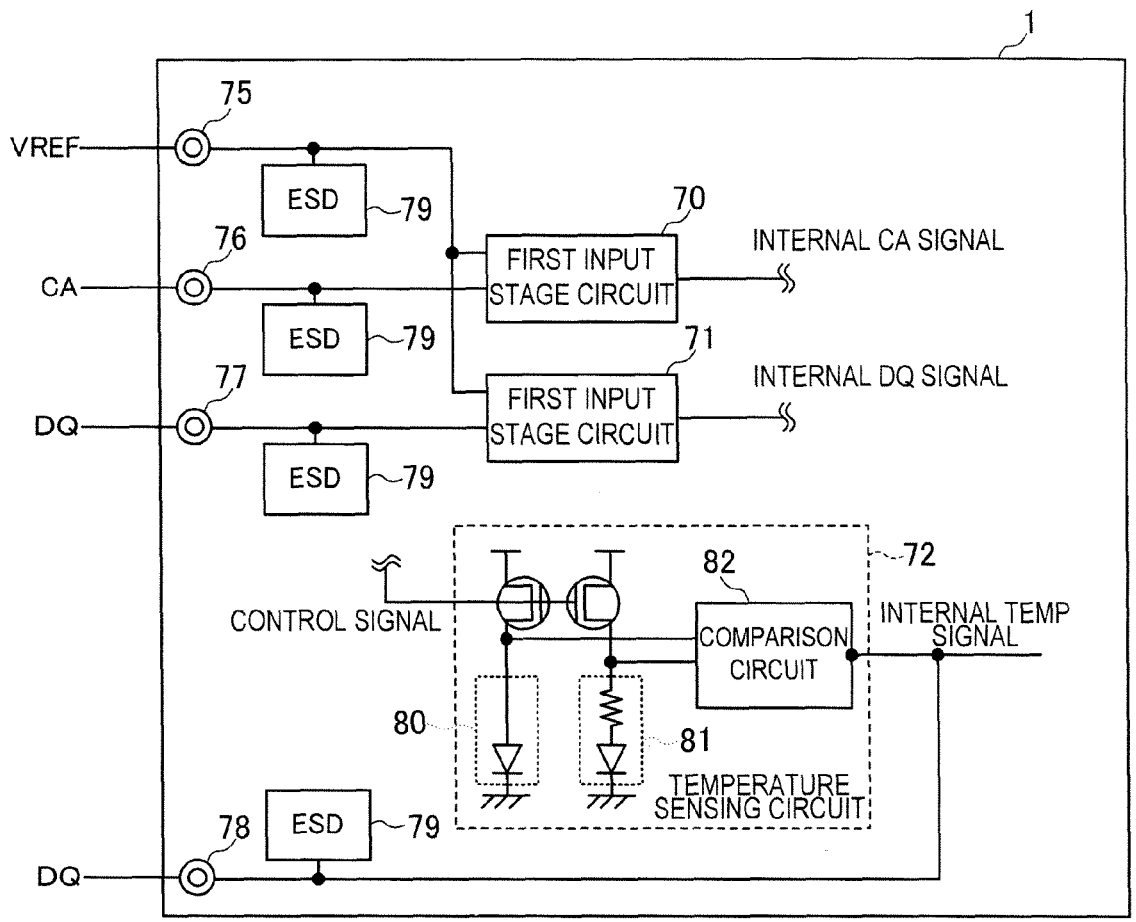
FIG. 5 is a circuit diagram showing part of the circuits included in the semiconductor device according to an embodiment of the present invention.

FIG. 5 is a circuit diagram showing part of the circuits included in the semiconductor device 1. As shown in the diagram, the semiconductor device 1 includes first input stage circuits 70 and 71, a temperature sensing circuit 72, a VREF terminal 75, a CA (Command/Address) terminal 76, a DQ (Data Queue) terminal 77, and a TEMP terminal 78.

The VREF terminal 75 is a terminal for accepting the input of a reference voltage, a constant voltage. The CA terminal 76 is a terminal for accepting the input of an address signal which specifies memory cells and a command signal which describes the control content of the semiconductor device 1. Hereinafter, the address signal and the command signal will be referred to collectively as a CA signal. The DQ terminal 77 is a terminal for inputting and outputting a data signal (DQ signal) which describes data to be stored in memory cells. The TEMP terminal 78 is a terminal for outputting temperature information which indicates the temperature of the semiconductor device 1. The terminals are each provided with an anti-ESD (ElectroStatic Discharge) circuit 79 for anti-ESD measures.

The first input stage circuit 70 is a circuit that compares the voltage of the CA signal (voltage input as the CA signal), which serves as a voltage to be compared, with the reference voltage which is input to the VREF terminal 75. Specifically, the first input stage circuit 70 makes a H/L determination whether or not the voltage of the CA signal is higher than the reference voltage. The first input stage circuit 70 then generates an internal CA signal (comparison result signal) having a voltage corresponding to the determination (a high voltage for a H determination, a low voltage for a L determination), and outputs the internal CA signal to a not-shown internal circuit.

The first input stage circuit 71 is a circuit that compares the voltage of the DQ signal (voltage input as the DQ signal), which serves as a voltage to be compared, with the reference voltage which is input to the VREF terminal 75. Specifically, the first input stage circuit 71 makes a H/L determination whether or not the voltage of the DQ signal is higher than the reference voltage. The first input stage circuit 71 then generates an internal DQ signal (comparison result signal) having a voltage corresponding to the determination (a high voltage for a H determination, a low voltage for a L determination), and outputs the internal DQ signal to a not-shown internal circuit.

The temperature sensing circuit 72 includes a first element 80 which is configured to have a temperature dependence, a second element 81 which is configured to have no temperature dependence, and a comparison circuit 82. The first element 80 is a resistor or a diode, for example. The second element 81 is a composite element consisting of a resistor and a diode connected in series, for example. As shown in FIG. 5, the first and second elements 80 and 81 are each connected between power supply wiring and ground wiring. P-channel MOS transistors are arranged between the power supply wiring and the respective elements. The P-channel MOS switch transistors accept a control signal (signal for activating the operation of the semiconductor device 1) from a not-shown control circuit, and are configured to turn on only when the control signal is activated. Consequently, the first and second elements 80 and 81 are connected to the power supply wiring only when the control signal is activated, and voltages corresponding to their respective resistances appear at the ends on the side of the power supply wiring.

The comparison circuit 82 compares the voltages appearing at the ends of the first and second elements 80 and 81 on the side of the power supply wiring. Specifically, the comparison circuit 82 makes a H/L determination whether or not a voltage to be compared is higher than a reference voltage, with the voltage appearing at the end of the first element 80 on the side of the power supply wiring as the voltage to be compared and the voltage appearing at the end of the second element 81 on the side of the power supply wiring as the reference voltage. The comparison circuit 82 then generates an internal TEMP signal (comparison result signal) having a voltage corresponding to the determination (a high voltage for a H determination, a low voltage for a L determination), and outputs the internal TEMP signal from the TEMP terminal 78 as well as to a not-shown internal circuit.

The MOS transistor 20b is suitably used for such first input stage circuits 70 and 71 and comparison circuit 82. Detailed description will be given below.

Figure 6:
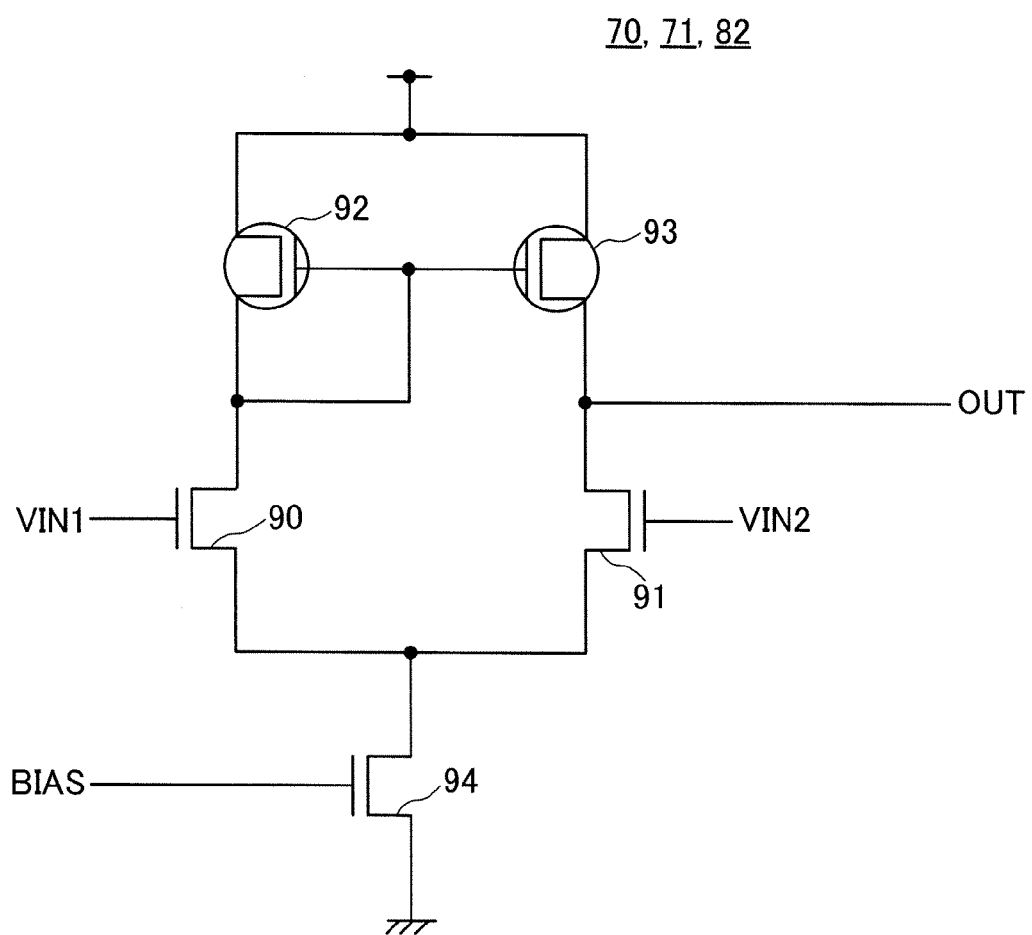
FIG. 6 is a diagram showing the internal circuit of the first input stage circuits and the comparison circuit according to an embodiment of the present invention.

FIG. 6 is a diagram showing the internal circuit of the first input stage circuits 70 and 71 and the comparison circuit 82. In the diagram, the voltage VIN1 represents the reference voltage, and the voltage VIN2 the voltage to be compared. The signal OUT is the comparison result signal, and the voltage BIAS is a vias voltage of the circuit.

As shown in FIG. 6, the first input stage circuits 70 and 71 and the comparison circuit 82 each include N-channel MOS transistors 90 and 91 (first and second transistors) and P-channel MOS transistors 92 and 93 (third and fourth transistors). The transistors 90 and 91 are connected in parallel between the power supply wiring and the ground wiring. The transistor 92 is connected between the transistor 90 and the power supply wiring. The transistor 93 is connected between the transistor 91 and the power supply wiring. An N-channel MOS transistor 94 is connected in common between the transistors 90 and 91 and the ground wiring.

The voltages VIN1 and VIN2 are input to the gates of the transistors 90 and 91, respectively. The signal OUT is taken out from the junction between the transistors 91 and 93. The voltage BIAS is input to the gate of the transistor 94. The gate of the transistor 92, the gate of the transistor 93, and the junction between the transistors 90 and 92 are connected to each other. That is, the transistors 92 and 93 are connected to form a current mirror.

With such a configuration, the signal OUT functions as a comparison result signal that has the voltage corresponding to the comparison result as described above.

For the first input stage circuits 70 and 71 and the comparison circuit 82 of the foregoing configuration, circuit symmetry is essential in order to obtain the comparison results with high accuracy. To ensure circuit symmetry, it is important for the transistors to have equal characteristics. Transistor characteristics depend largely on PVT (Process, Voltage, and Temperature). Since the effects decrease with the increasing gate length L of the transistors, it is preferred that the transistors 90 to 94 have a gate length L as large as possible.

The larger the gate length L, the lower the transistor's current supplying capability. In order to compensate the drop in the current supplying capability due to the increased gate length L, it is desired to use transistors having particularly large gate widths W for the transistors 90 to 94. Ring-gate MOS transistors are capable of large gate widths W in the first place, and the diameters of the gate electrodes are typically increased to provide even greater gate widths W. This produces wide open areas in the inner ring regions, which have caused the foregoing dishing phenomenon heretofore. The occurrence of such dishing phenomenon is suppressed by using the MOS transistor 20b as the transistors 90, 91, and 94, and using a P-channel MOS transistor having the same structure and same internal dummy electrode 40 as those of the MOS transistor 20b as the transistors 92 and 93.

While the foregoing example is predicated on the use of the MOS transistor 20b for all the transistors 90 to 94, the MOS transistor 20b need not necessarily be used for all the transistors. For example, the common transistor 94 need not necessarily be the MOS transistor 20b since what is important to the circuit is the symmetry between the reference voltage and the voltage to be compared. Moreover, since it is needed only that the symmetry be maintained between the transistors 90 and 91 and between the transistors 92 and 93, the transistors 90 and 91 may be MOS transistors of different structure than the transistors 92 and 93. As an example, a P-channel MOS transistor having the same structure and same internal dummy electrode 40 as those of a MOS transistor 20c to be described later may be used as the transistors 92 and 93 while the MOS transistor 20b is used as the transistors 90 and 91.

Hereinafter, the ring-gate MOS transistors that employ the third to sixth configuration patterns will be described in order. Each of the MOS transistors described below is an N-channel MOS transistor, having the same basic structure as that of the foregoing MOS transistor 20b. The main differences from the MOS transistor 20b lie in the configuration pattern of the internal dummy electrode(s) 41.

Figure 7:
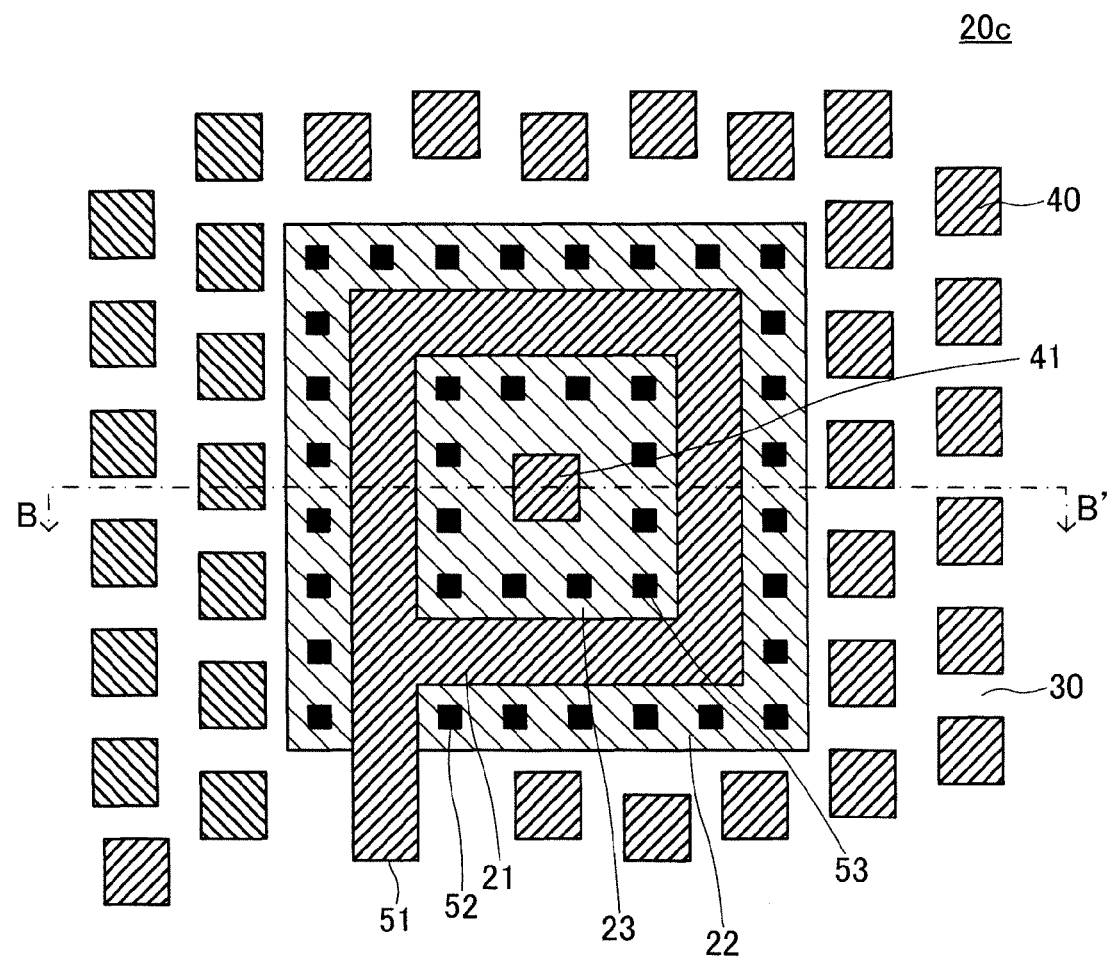
FIG. 7 is a diagram showing the planar structure of a MOS transistor which employs the third configuration pattern according to an embodiment of the present invention.
Figure 8:
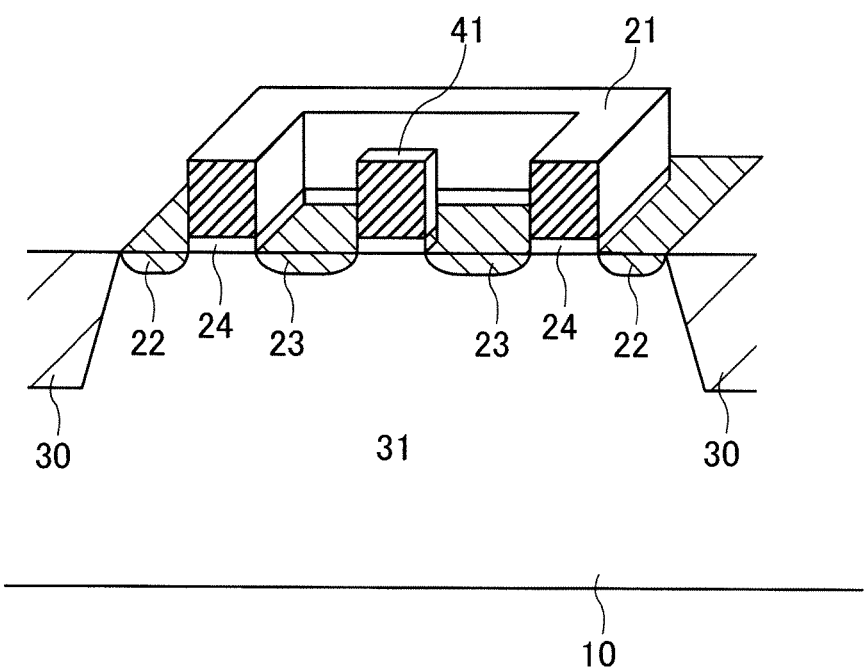
FIG. 8 is a perspective half sectional view showing a cross section of the semiconductor device corresponding to the section that is taken along the line B-B' of FIG. 7.

Initially, FIG. 7 is a diagram showing the planar structure of a MOS transistor 20c which employs the third configuration pattern. FIG. 8 is a perspective half sectional view showing a cross section of the semiconductor device 1 corresponding to the section that is taken along the line B-B' of FIG. 7. As with FIG. 3, the contact conductors 52 and 53 and external dummy electrodes 40 are omitted in FIG. 8. As with FIGS. 2 and 3, the interlayer insulating film that covers the entire MOS transistor 20c is omitted in FIGS. 7 and 8.

As shown in FIGS. 7 and 8, the MOS transistor 20c is different from the MOS transistor 20b in that the element isolation region 31 is not formed. Since there is no element isolation region 31, the internal dummy electrode 41 is formed directly on the surface of the substrate 10 as shown in FIG. 8.

In the MOS transistor 20c, the second diffusion region 23 can be formed wider than in the MOS transistor 20b as much as there is no element isolation region 31. The MOS transistor 20c is thus suited to when the inner ring region is relatively narrow.

Figure 9:
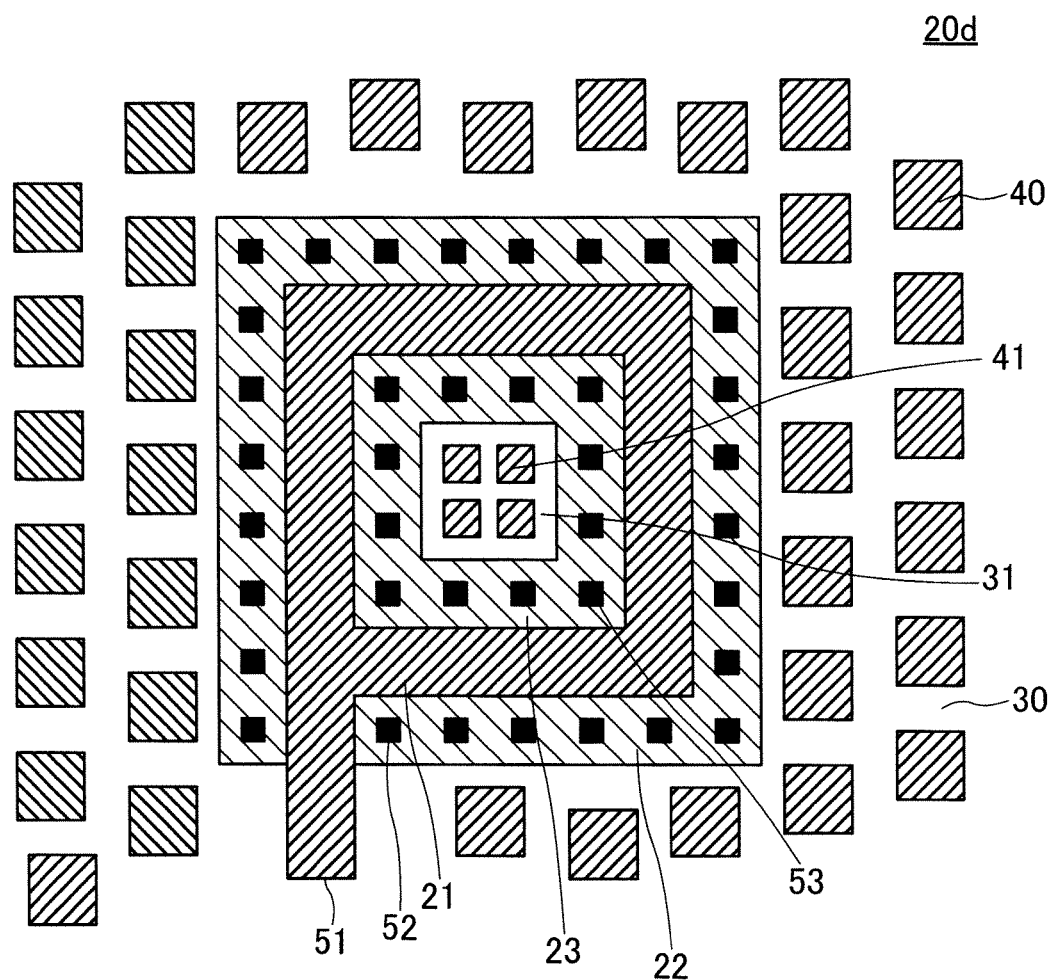
FIG. 9 is a diagram showing the planar structure of a MOS transistor which employs the fourth configuration pattern according to an embodiment of the present invention.

FIG. 9 is a diagram showing the planar structure of a MOS transistor 20d which employs the fourth configuration pattern.

As shown in FIG. 9, the MOS transistor 20d is different from the MOS transistor 20a in that a plurality of internal dummy electrodes 41 are formed on the element isolation region 31. While there are four internal dummy electrodes 41 in FIG. 9, the number of internal dummy electrodes 41 is not limited to four and may be determined depending on the area of the inner ring region etc. The MOS transistor 20d is suited to when the inner ring region is particularly large in area.

Figure 10:
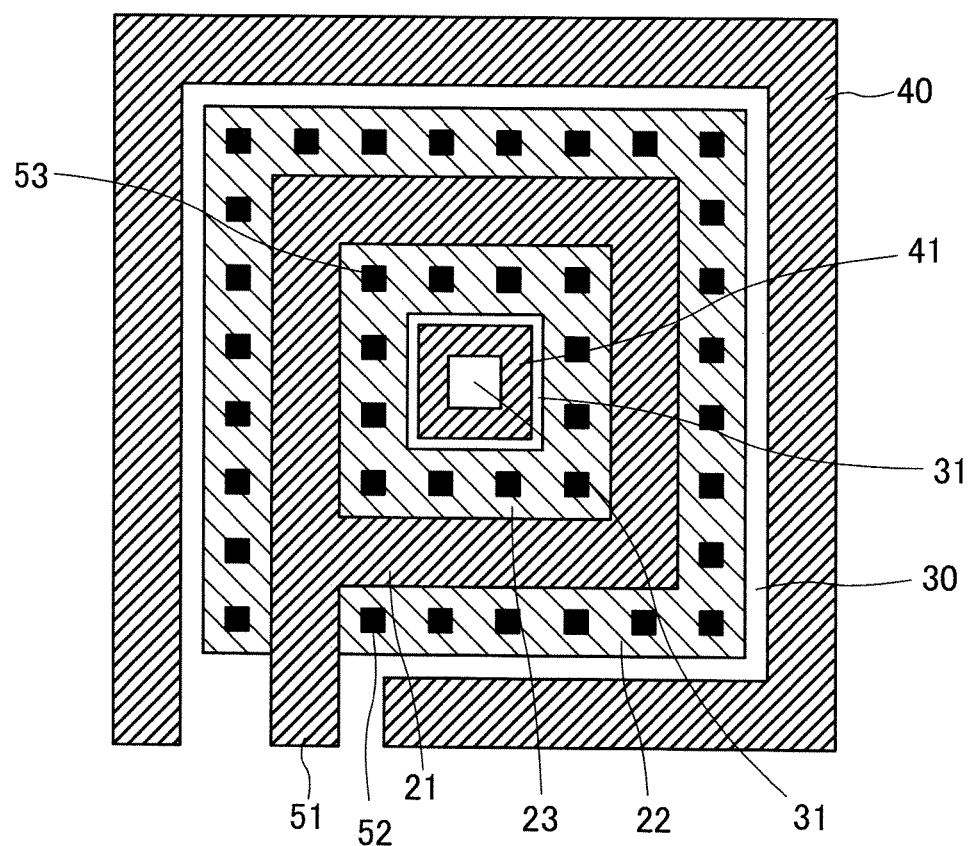
FIG. 10 is a diagram showing the planar structure of a MOS transistor which employs the fifth configuration pattern according to an embodiment of the present invention.

FIG. 10 is a diagram showing the planar structure of a MOS transistor 20e which employs the fifth configuration pattern.

As shown in FIG. 10, the MOS transistor 20e is different from the MOS transistor 20b in that the internal dummy electrode 41 and the external dummy electrodes 40 are shaped not like grains but like rings (including cut ring shapes). As can be seen, the internal and external dummy electrodes 41 and 40 may have various shapes. The MOS transistor 20e is also suited to when the inner ring region is particularly large in area.

Figure 11:
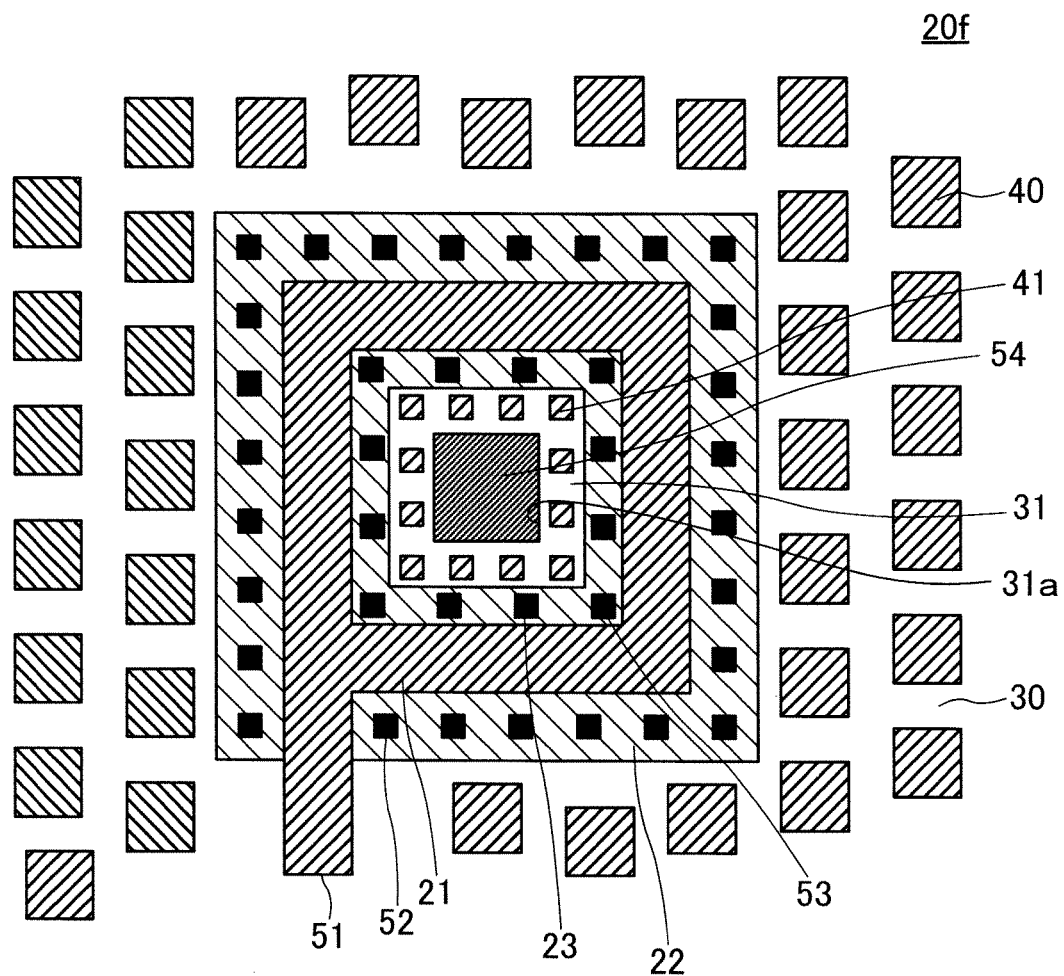
FIG. 11 is a diagram showing the planar structure of a MOS transistor which employs the sixth configuration pattern according to an embodiment of the present invention.

FIG. 11 is a diagram showing the planar structure of a MOS transistor 20f which employs the sixth configuration pattern.

As shown in FIG. 11, the MOS transistor 20f is the same as the MOS transistor 20d in that there are a plurality of internal dummy electrodes 41, but different from the MOS transistor 20d in that the element isolation region 31 has a tubular configuration. The surface of the substrate 10 (the surface of the P-type diffusion region) is exposed in an inner area 31a of the element isolation region 31. The MOS transistor 20f has a contact conductor 54 which is formed on the exposed portion, whereby the surface of the substrate 10 is connected to not-shown ground wiring in an upper layer. Such configuration can be employed to provide a sufficient supply of the substrate potential to the MOS transistor 20f. This allows stable operation.

Up to this point, the first to sixth configuration patterns of the ring-gate MOS transistors have been described. Which configuration pattern to employ for each of a large number of ring-gate MOS transistors included in the semiconductor device 1 is determined when designing the semiconductor device 1. Hereinafter, description will be given of a design apparatus and program for making such a design.

Figure 12A:
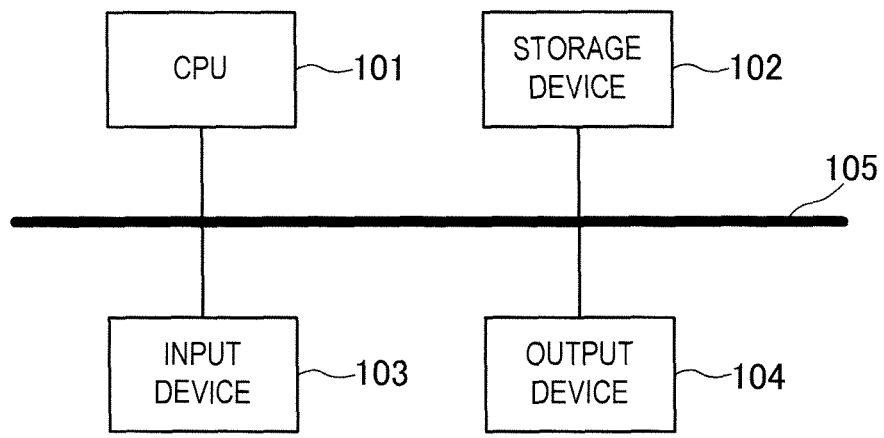
FIG. 12A is a diagram showing the system configuration of a computer which functions as the design apparatus for designing the semiconductor device according to an embodiment of the present invention.

FIG. 12A is a diagram showing the system configuration of a computer 100 which functions as the design apparatus for designing the semiconductor device 1. As shown in the diagram, the computer 100 includes a CPU 101, a storage device 102, an input device 103, and an output device 104, which are connected to each other through a bus 105.

The CPU 101 has the functions of controlling the components of the computer 100 and performing various types of processing according to programs and data stored in the storage device 102. The storage device 102 includes a main storage device which is composed of a cache memory, DRAM, and the like, and an auxiliary storage device which is composed of a hard disk etc. The storage device 102 contains programs and data for making the computer 100 function as the apparatus for designing the semiconductor device 1. The input device 103 includes input devices intended for a human-machine interface such as a keyboard and a mouse, and a scanner for reading printed information and facilities for accepting signals from other computers over a network. The output device 104 includes output devices intended for a human-machine interface such as a display, as well as a printer and facilities for transmitting signals to other computers over a network.

Figure 12B:
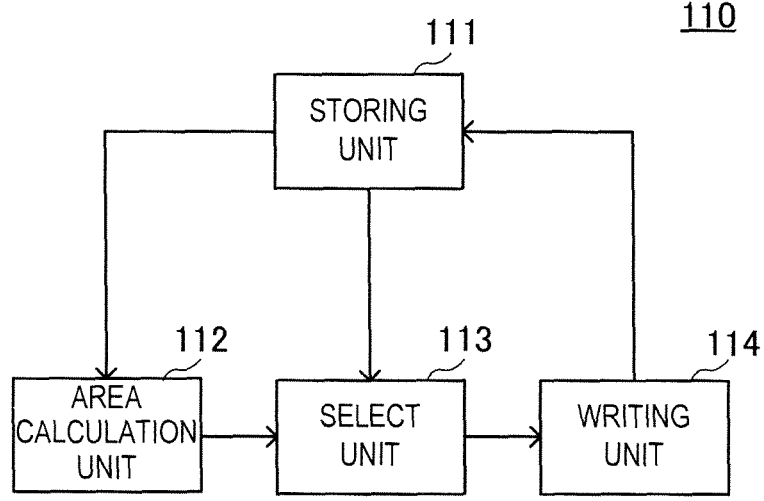
FIG. 12B is a block diagram showing the functional blocks of a design apparatus according to an embodiment of the present invention.

FIG. 12B is a block diagram showing the functional blocks of a design apparatus 110 that is implemented by the computer 100. As shown in the diagram, the design apparatus 110 functionally includes a storing unit 111 (storing unit), an area calculation unit 112 (area information acquiring unit), a select unit 113 (selecting unit), and a writing unit 114.

The storing unit 111 contains in advance a planar layout chart of the semiconductor device 1 that is created without consideration of internal dummy electrodes 41. The storing unit 111 also contains in advance a table that shows the correspondence between the area S of an inner ring region (inner ring area S) and the foregoing configuration patterns. Table 1 below shows an example of the correspondence table. In the example, the inner ring area S has two thresholds A and B (A<B). The relationship in size between the inner ring area S and the thresholds A and B is stored in association with the first to third configuration patterns.

TABLE 1

| Inner ring area S | Configuration pattern |
|---|---|
| S < A | First configuration pattern (MOS transistor 20a) |
| A ≤ S < B | Third configuration pattern (MOS transistor 20c) |
| B ≤ S | Second configuration pattern (MOS transistor 20b) |

Figure 13:
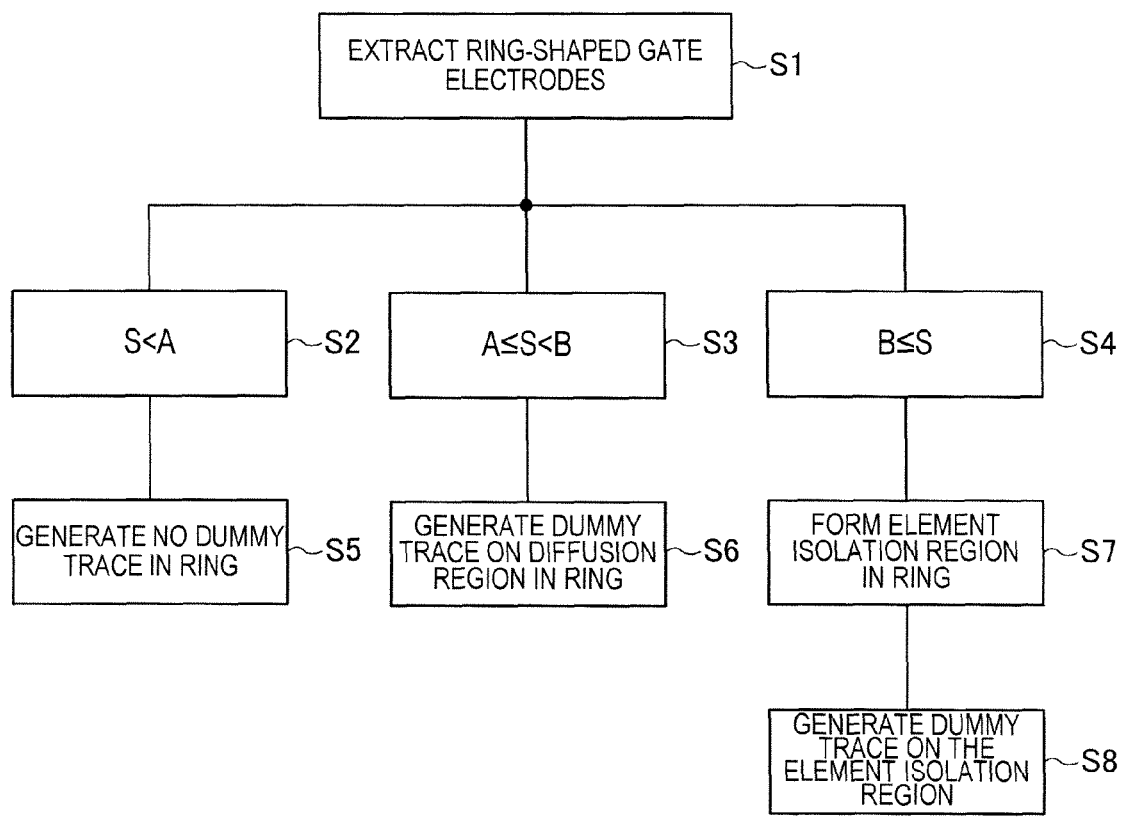
FIG. 13 is a flowchart for explaining the operation of the design apparatus according to an embodiment of the present invention.

FIG. 13 is a flowchart for explaining the operation of the design apparatus 110. The flowchart is predicated on the foregoing Table 1. Hereinafter, the rest of the functional blocks of the design apparatus 110 will be described also with reference to the flowchart.

Initially, the area calculation unit 112 acquires area information which shows inner ring areas. Specifically, the area calculation unit 112 reads the planar layout chart stored in the storing unit 111, and performs image recognition processing to extract the ring-shaped gate electrodes 21 (step S1). Based on the result of extraction, the area calculation unit 112 calculates the inner ring area S of each of the gate electrodes 21.

Next, the select unit 113 compares the calculated inner ring area S with the thresholds A and B stored in the storing unit 111 (step S2 to S4). The select unit 113 then selects a configuration pattern according to Table 1.

The writing unit 114 generates internal dummy electrodes 41 according to the configuration pattern selected by the select unit 113. Specifically, if the inner ring area S is smaller than the threshold A, the writing unit 114 generates no internal dummy electrode 41 based on the first configuration pattern (step S5). If the inner ring area S is greater than or equal to the threshold A and smaller than the threshold B, the writing unit 114 generates an internal dummy electrode 41 without an element isolation region 31 in the inner ring region based on the third configuration pattern, and writes the internal dummy electrode 41 into the planar layout chart (step S6). If the inner ring area S is greater than or equal to the threshold B, the writing unit 114 generates an element isolation region 31 in the inner ring region and generates an internal dummy electrode 41 based on the second configuration pattern, and writes the element isolation region 31 and the internal dummy electrode 41 into the planar layout chart (steps S7 and S8).

As has been described above, according to the design apparatus 110, it is possible to automatically design the semiconductor device 1 that has internal dummy electrodes 41 based on the first to third configuration patterns.

While the description has dealt only with the first to third configuration patterns, other configuration patterns may be similarly included in the automatic designing of the design apparatus.

The number, sizes, positions, and shapes of internal dummy electrodes 41, and the size, position, and shape of the element isolation region 31 may be stored in the storing unit 111, for example, in association with specific values of the inner ring area S. This makes it possible to change the number, sizes, positions, and shapes of internal dummy electrodes 41, and the size, position, and shape of the element isolation region 31 for the writing unit 114 to generate depending on specific values of the inner ring area S.

Up to this point, the preferred embodiment of the present invention has been described. The present invention, however, is not limited to the foregoing embodiment. It will be understood that various modifications may be made without departing from the gist of the present invention, and all such modifications are intended to be embraced within the scope of the present invention.

For example, while the foregoing embodiment has dealt with the case where the present invention is applied to a semiconductor memory device, the present invention is suitably applicable to any transistor that has an inner ring area so large as to cause the dishing phenomenon.

The foregoing embodiment has also dealt with the case where the present invention is applied to N-channel MOS transistors. However, the present invention may be applied to P-channel MOS transistors as well as N-channel MOS transistors. The present invention is also applicable to other field effect transistors in general, including a metal-insulator-semiconductor (MIS) transistor etc.

The foregoing embodiment has also dealt with the cases where the internal dummy electrode(s) 41 accompanied by the element isolation region 31 is/are formed at a certain distance from the border between the element isolation region 31 and the second diffusion region 23. However, the internal dummy electrode (s) 41 may be formed astride the border. That is, the second diffusion region 23 may be formed in an area where it overlaps the internal dummy electrode(s) 41 when viewed in a vertical direction.

In addition, while not specifically claimed in the claim section, the applicant reserves the right to include in the claim section of the application at any appropriate time the following design apparatus and computer-readable medium:

A1. A design apparatus comprising:
a storing unit storing a plurality of configuration patterns of internal dummy electrodes to be arranged inside a gate electrode of a ring-gate transistor;
an area information acquiring unit acquiring area information that shows an inner ring area of the ring-gate transistor; and
a selecting unit selecting and outputting one of the plurality of configuration patterns stored in the storing unit depending on the area information acquired by the area information acquiring unit.

A2. The design apparatus in A1, wherein the plurality of configuration patterns include:
a first configuration pattern in which no internal dummy electrode is provided;
a second configuration pattern in which an element isolation region is formed in a substrate corresponding to inside the gate electrode, and an internal dummy electrode is arranged on the element isolation region, the ring-gate transistor being formed on the surface of the substrate; and
a third configuration pattern in which an internal dummy electrode is arranged without formation of an element isolation region in the substrate corresponding to inside the gate electrode, the ring-gate transistor being formed on the surface of the substrate, and wherein
the selecting unit selects the first configuration pattern if the inner ring area shown by the area information is smaller than a first value,
the selecting unit selects the third configuration pattern if the inner ring area shown by the area information is greater than or equal to the first value and smaller than a second value that is greater than the first value, and
the selecting unit selects the second configuration pattern if the inner ring area shown by the area information is greater than or equal to the second value.

B1. A computer-readable medium including a computer program making a computer that includes a storing unit storing a plurality of configuration patterns of internal dummy electrodes to be arranged inside a gate electrode of a ring-gate transistor, function as:
an area information acquiring unit acquiring area information that shows an inner ring area of the ring-gate transistor; and
a selecting unit selecting and outputting one of the plurality of configuration patterns stored in the storing unit depending on the area information acquired by the area information acquiring unit.

What is claimed is:

1. A semiconductor device comprising:
a substrate;
a transistor that has a ring-shaped gate electrode formed on the substrate;
a plurality of external dummy electrodes that are arranged outside the gate electrode and are formed in a same layer as the gate electrode; and
at least one internal dummy electrode that is arranged inside the gate electrode and is formed in the same layer as the gate electrode.

2. The semiconductor device as claimed in claim 1, wherein the transistor includes:
a first diffusion region formed in the substrate corresponding to outside the gate electrode;
a second diffusion region formed in the substrate corresponding to inside the gate electrode; and
a gate insulating film formed between the gate electrode and the substrate.

3. The semiconductor device as claimed in claim 1, further comprising an element isolation region that is embedded in the substrate corresponding to inside the gate electrode,
wherein the internal dummy electrode is formed on the element isolation region.

4. The semiconductor device as claimed in claim 3, wherein
the element isolation region has a ring shape in which a portion of the substrate surrounded by the element isolation region is exposed,
the semiconductor device further comprising:
substrate potential wiring that supplies a substrate potential to the substrate; and
a contact conductor that connects the substrate potential wiring to the substrate at the portion surrounded by the element isolation region.

5. The semiconductor device as claimed in claim 1, wherein a plurality of the internal dummy electrodes are provided.

6. The semiconductor device as claimed in claim 1, wherein the internal dummy electrode has a ring shape.

7. The semiconductor device as claimed in claim 1, further comprising a comparison circuit that compares a voltage to be compared and a reference voltage, and outputs a comparison result signal having a voltage corresponding to the result of comparison,
wherein the transistor is one that constitutes the comparison circuit.

8. The semiconductor device as claimed in claim 7, further comprising a plurality of memory cells,
wherein the voltage to be compared is a voltage of an address signal which specifies at least one of the plurality of memory cells.

9. The semiconductor device as claimed in claim 7, wherein the voltage to be compared is a voltage of a command signal which describes control content of the semiconductor device.

10. The semiconductor device as claimed in claim 7, further comprising a memory cell,
wherein the voltage to be compared is a voltage of a data signal which describes data to be stored in the memory cell.

11. The semiconductor device as claimed in claim 7, further comprising a temperature sensing circuit including the comparison circuit, a first element having a temperature dependence, and a second element having no temperature dependence, wherein
the first and second elements are connected in parallel between a power supply wiring and a ground wiring,
the voltage to be compared is a voltage that appears at an end of the first element, and
the reference voltage is a voltage that appears at an end of the second element.

12. A semiconductor device comprising a comparison circuit that compares a voltage to be compared and a reference voltage, and outputs a comparison result signal having a voltage corresponding to the result of comparison, wherein
the comparison circuit including:
first and second transistors that are connected in parallel between a power supply wiring and a ground wiring,
a third transistor that is connected between the first transistor and the power supply wiring, and
a fourth transistor that is connected between the second transistor and the power supply wiring, wherein
a gate of the third transistor, a gate of the fourth transistor, and a connection point between the first transistor and the third transistor are connected to one another, the reference voltage is supplied to either one of gates of the first and second transistors, the voltage to be compared is supplied to other of the gates of the first and second transistors, the comparison result signal is output from a connection point between the second transistor and the fourth transistor, the first to fourth transistors have respective ring-shaped first to fourth gate electrodes, wherein the semiconductor device further comprises:

a plurality of external dummy electrodes that are arranged outside the first to fourth gate electrodes; and first to fourth internal dummy electrodes that are arranged inside the first to fourth gate electrodes, respectively, and wherein the first to fourth gate electrodes, the plurality of external dummy electrodes, and the first to fourth internal dummy electrodes are formed in the same layer.

13. The semiconductor device as claimed in claim 12, further comprising a plurality of memory cells, wherein the voltage to be compared is a voltage of an address signal which specifies at least one of the plurality of memory cells.

14. The semiconductor device as claimed in claim 12, wherein the voltage to be compared is a voltage of a command signal which describes control content of the semiconductor device.

15. The semiconductor device as claimed in claim 12, further comprising a memory cell, wherein the voltage to be compared is a voltage of a data signal which describes data to be stored in the memory cell.

16. The semiconductor device as claimed in claim 12, further comprising a temperature sensing circuit including the comparison circuit, a first element having a temperature dependence, and a second element having no temperature dependence, wherein the first and second elements are connected in parallel between a power supply wiring and a ground wiring, the voltage to be compared is a voltage that appears at an end of the first element, and the reference voltage is a voltage that appears at an end of the second element.

17. A semiconductor device comprising:

a substrate;

first to fifth transistors that each includes a ring-shaped gate electrode formed on the substrate, a gate insulating film formed between the gate electrode and the substrate, a first diffusion region formed in the substrate corresponding to outside the gate electrode, and a second diffusion region formed in the substrate corresponding to inside the gate electrode;

a first internal dummy electrode that is arranged inside and is formed in a same layer as the gate electrodes of the first transistor;

a second internal dummy electrode that is arranged inside and is formed in the same layer as the gate electrode of the second transistor;

a third internal dummy electrode that is arranged inside and is formed in the same layer as the gate electrode of the third transistor;

a fourth internal dummy electrode that is arranged inside and is formed in the same layer as the gate electrode of the fourth transistor;

a fifth internal dummy electrode that is arranged inside and is formed in the same layer as the gate electrode of the fifth transistor;

first element isolation region that is embedded in the substrate corresponding to inside the gate electrodes of the first transistor;

second element isolation region that is embedded in the substrate corresponding to inside the gate electrodes of the second transistor;

substrate potential wiring that supplies a substrate potential; and a contact conductor that connects the substrate potential wiring and the substrate, wherein the first internal dummy electrode is formed on the first element isolation region, the second element isolation region has an opening, the contact conductor connecting the substrate potential wiring and the substrate through the opening, no element isolation region being formed in a region corresponding to inside the gate electrode of the third transistor, a plurality of the fourth internal dummy electrodes is provided, the fifth internal dummy electrode having a ring shape.

* * * * *